(12) United States Patent
Stauffer et al.

(10) Patent No.: US 7,759,604 B2
(45) Date of Patent: Jul. 20, 2010

(54) METHOD FOR HIGH-PRECISION FIXING OF A MINIATURIZED COMPONENT ON A SUPPORT PLATE

(75) Inventors: Laurent Stauffer, Widnau (CH); Peter Kipfer, Marbach (CH); Heinz Bernhard, Berneck (CH)

(73) Assignee: Leica Geosystems AG, Heerbrugg (CH)

( * ) Notice: Subject to any disclaimer, the term of this patent is extended or adjusted under 35 U.S.C. 154(b) by 1028 days.

(21) Appl. No.: 11/460,206

(22) Filed: Jul. 26, 2006

(65) Prior Publication Data
US 2007/0033781 A1 Feb. 15, 2007

(30) Foreign Application Priority Data
Jul. 27, 2005 (EP) ................................. 05106921

(51) Int. Cl.
*B23K 26/20* (2006.01)
*B23K 1/005* (2006.01)
(52) U.S. Cl. .......................... 219/121.64; 219/121.85; 228/258
(58) Field of Classification Search .................
219/121.63–121.66, 121.82–121.85, 121.13–121.17, 219/121.31, 121.35; 228/256–258, 33; 385/91
See application file for complete search history.

(56) References Cited
U.S. PATENT DOCUMENTS
5,935,294 A * 8/1999 Weekamp et al. ............. 75/336

7,159,312 B2 * 1/2007 Mongold et al. ............... 29/843
7,504,604 B2 * 3/2009 Rossopoulos et al. .. 219/121.66

FOREIGN PATENT DOCUMENTS

| EP | 0 758 145 A | 2/1997 |
| JP | 361232080 A | * 10/1986 |
| WO | WO 99/26754 A | 6/1999 |
| WO | WO 2004/050287 A | 6/2004 |

* cited by examiner

*Primary Examiner*—Samuel M Heinrich
(74) *Attorney, Agent, or Firm*—Workman Nydegger

(57) ABSTRACT

The invention relates to a method for high-precision fixing of a miniaturized component (1), in particular having a microoptical element (2), on a predetermined fixing section (3) of a support plate (4) by a solder joint. The support plate is formed throughout from a metallic material and has a cut-out region (10) which encloses the fixing section (3), is bridged by at least one connecting web (9) of the support plate (4), keeps the heat transfer from the fixing section (3) to the remaining support plate low and compensates lateral thermal expansions of the fixing section (3). Solder material (8) is applied on the top of the fixing section (3). The method comprises in particular the steps: arrangement of the component (1) above the fixing section (3), the solder material (8) and the base (7) of the component (1) being present in opposite positions without contact and forming a space. Supply of electromagnetic radiation (12) to the bottom (6) of the fixing section (3) for melting the solder material (8') so that, as a result of drop formation and optionally as a result of lowering of the component (1) the space fills with molten solder material (8') for mutual fixing. Waiting for the mutual fixing by resolidification of the molten solder material (8').

21 Claims, 2 Drawing Sheets

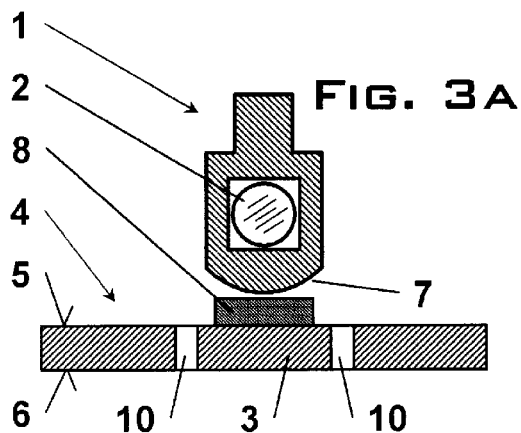
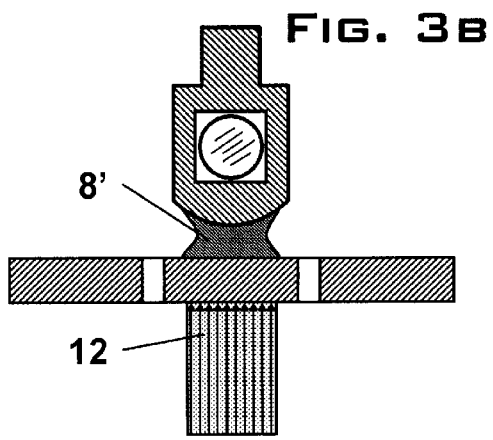
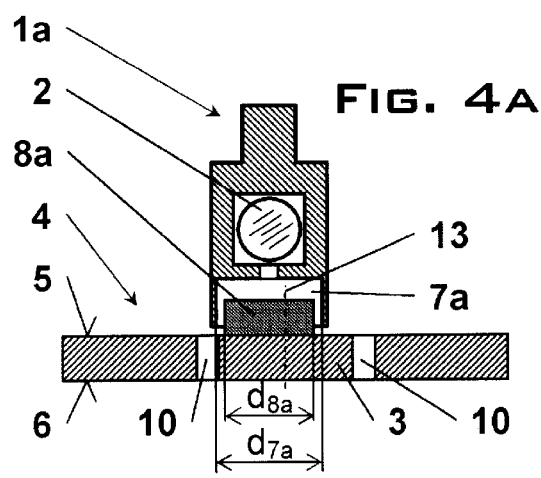
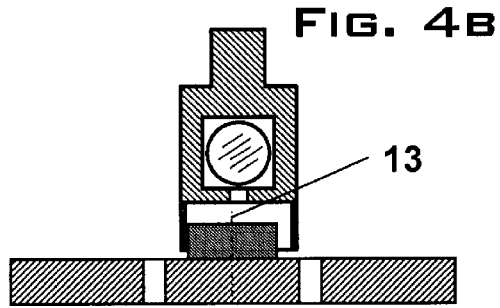
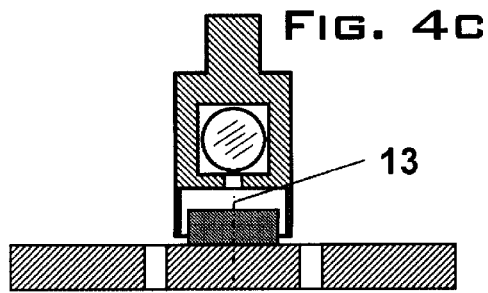
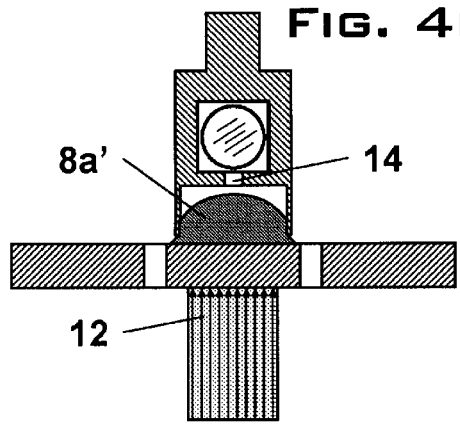

METHOD FOR HIGH-PRECISION FIXING OF A MINIATURIZED COMPONENT ON A SUPPORT PLATE

The present invention relates to a method for the high-precision fixing of a miniaturized component on a pre-determined fixing section of a support plate by means of a solder joint.

Different methods for fixing miniaturized components by means of a solder joint are disclosed in the prior art.

WO 99/26754 describes a method for soldering miniaturized components on a planar substrate which is formed, for example, from a sapphire plate or a Pyrex, quartz or Zerodur plate. The substrate plate is at least partly coated with a lattice-like metal pattern or metal structure. According to WO 99/26754, the pattern structure is composed of a lattice of area elements or a row of strips which preferably intersect one another perpendicularly and form a lattice or some other structure which is characterized by a uniform alternation of metal regions and free regions. The area elements may assume a rectangular shape, a square shape, a round shape or any shape which is suitable for use in this method. Here, the pattern step width should be at least an order of magnitude smaller than the dimensions of that side of the component which is to be fastened. The solder material is supplied to the metal side of the component, which side is to be fixed and in particular is convex. The component is arranged above the substrate plate, the planar metal pattern and the solder material layer of the component being present vertically opposite one another without contact and a distance apart. Heat energy—in particular laser radiation—is then supplied from the uncoated side of the flat substrate plate for melting the solder material of the solder material layer on the coated side on which the component too is arranged, until the solder material forms a drop, with the result that the solder material drop fills the space between the component and the substrate plate for mutual fixing. The metallized pattern regions provide a fixing region for the solder material, while the metal-free regions make it possible for a sufficient quantity of energy to pass through the substrate plate for directly melting the solder material. When heat energy is supplied, a part of the energy thus passes through the uncoated regions of the metal pattern. That part which reaches those regions of the metal pattern which are coated with metal either heats the metal layer or is reflected. The energy is preferably applied by means of a laser beam. Owing to the lattice structure of the metal pattern on the substrate plate, the choice of a suitable light absorption coefficient of the metal layer is particularly important since firstly the substrate plate must not be overheated and secondly a certain minimum temperature is required for carrying out the process. In the method described in WO 99/26754, usually about 70% of the surface of the flat substrate plates with the metal pattern are covered with metal. In practice, it has been found that the solder material close to the transverse sides of the component cools substantially more rapidly than the remainder of the solder material. This can lead to asymmetries of the solidified solder material. Since a plurality of different materials border one another during the fixing, different co-efficients of thermal expansion of the flat substrate plate, of the metal layer present thereon, of the solder material and of the component can cause great stresses and distortions after the soldering method has been carried out. Owing to the different materials on the top and bottom, unavoidable temperature differences between the lower and upper sides of the substrate plate can even lead to curving of the flat substrate plate, with the result that the accuracy of positioning is adversely affected. Depending on the mechanical resistance of the support material a parasitic local deformation can form in the region of the solder joint owing to the high stresses. A further problem is the relatively complex structure of the substrate plate since the planar substrate, which is formed, for example, from a sapphire plate or a Pyrex, quartz or Zerodur plate, has to be coated with the lattice-like metal pattern or the metal structure by means of relatively complicated methods. In the known method, owing to the presence of metal-free regions, free positioning of the component is possible only to a limited extent, especially in discrete steps on the pattern structure. Accuracies of about 2 micron in the 6 degrees of freedom are achievable by the known method described above. Particularly for the mounting of components which comprise or carry microoptical elements, however, even higher accuracies of mounting are required. At least accuracies of positioning of less than 1 micron or 0.1 mrad are desirable.

One solution for improving the method disclosed in WO 99/26754 is described in WO 2004/050287 A1 of the same Applicant. In this method, the metal layer is applied extensively and continuously in the form of a cohesive layer on the flat substrate plate. A further layer of solder material, which is likewise cohesive or pattern-like, is present directly on this metal layer. The metal layer is heated in a localized region—for example by means of a laser beam—from the underside of the substrate plate which is substantially transparent to laser radiation, by absorption of the laser radiation. The metal layer acts thereby like a hot plate so that the solder material arranged thereon melts and fills the space between the metal layer and the component in a known manner by drop formation for mutual fixing. An advantage of this method is that, owing to the continuous, extensive metal layer, a substantially higher accuracy of final positioning of the component on the substrate plate is achieved in comparison with the previously known metal pattern method, since the cohesive metal surface is substantially more easily and homogeneously wetted with the solder material than is the case with an interrupted metal pattern layer. Accuracies of fixing in the region of 0.25 micron are allegedly achieved by the soldering method described, so that this method can be used for high-precision mounting of microoptical components on a substrate plate.

The two methods from WO 99/26754 and WO 2004/050287 A1 are suitable in particular for use in an automatic, flux-free laser soldering process since substantially all required steps can be carried out by handling robots which have a highly accurate position sensor system. Thus, each component can be positioned freely in space with high precision in all 6 degrees of freedom. If the entire substrate plate is coated with the planar metal layer, it is possible to position the component by free positioning of a flat piece of solder material or, in the case of a solder material layer, to position the component in any desired position on the flat substrate plate. The miniaturized component may serve, for example, as a holder for a microoptical element, e.g. a lens, an optical fiber, a laser diode, etc. Such microoptical components typically have a diameter of the order of magnitude of 2 mm and a height of 3 mm. A possible example of a holding device for a microoptical component is described in EP 1127287 B1.

Numerous other methods for fixing small components on a support plate are known from the area of insertion technology for electronic surface-mounted circuits, SMD technology. In the case of electronic circuits, however, the requirements differ completely from those in the mounting of microoptical components since, in the case of electronic circuits, lower precisions are required and highly accurate orientation in all 6 degrees of freedom is not necessary. Moreover, by definition electronic circuits must be mounted on interrupted metal layers since the mounting of a multiplicity of electronic components on a circuit board having a single uninterrupted metal layer would be inexpedient. The highly precise orientability of components on a support plate is neither required nor desired in the case of electronic circuits but is of decisive importance, for example, for the assembly of a microoptical system on a support plate. Thus, approaches from electronic circuit board insertion technology are suitable only to a limited extent.

Owing to the at least partly free orientability of the components possibly in all 6 degrees of freedom, the positioning system by means of which the components are positioned on the flat substrate plate and held during the soldering method has to meet high requirements.

WO 2004/052070 A1 likewise of the same Applicant, describes a method, a device and a system for the highly accurate fixing of a miniaturized component—carrying or containing in particular at least one optical element—on a flat support plate by a solder, weld or adhesive joint. The component is positioned by means of a gripper of a robot station above the support plate relative to external reference points, preferably 5 of the 6 degrees of freedom corresponding very accurately to the required position of the component. The perpendicular distance between the component and the support plate is equal to the required distance plus an additional dimension which corresponds to the degree of shrinkage of the joint. A joint is subsequently produced between the component and the support plate, a joint between the component and the support plate solidifying with shrinkage and hence exerting a tensile force in the perpendicular direction on the gripper holding the component. Simultaneously with the shrinkage, the gripper performs a controlled or regulated perpendicular movement in the direction of the support plate—optionally up to a vertical defined required position—and thus actively follows the shrinkage so that the build-up of high stresses is substantially prevented and no change in position is triggered when the gripper releases the component. The gripper performs no change of position horizontally to the support plate during the solidification process. Furthermore, a gripper for use in the method is described.

The method known to date from the prior art for high-precision soldering of miniaturized components on a planar substrate plate have a plurality of weak points which could not be adequately eliminated to date. Different coefficients of thermal expansion between the substrate plate and the solder material and between the solder material and the component lead to permanent mechanical stresses. The low tensile strength of the substrate plate, in particular of the Pyrex mainly used leads, in some cases with the solder alloys SnAg and AuSn, to the formation of cracks during the soldering process or in the course of the life of the product. Different temperatures between the upper and the lower side of the substrate plate cause bimetal-like bending of the substrate plate, which is very problematic particularly in the assembly of complex miniature optical systems on the substrate plate. The high costs of a suitable substrate plate, which consists in particular of sapphire, Pyrex, quartz or Zerodur, and the poor processibility of these materials with or without cutting have a disadvantageous effect on the cost-efficiency of the known methods. The brittle behavior of the materials suitable for the substrate plate means that ready-equipped substrate plates have to be fastened by means of adhesive bonding in the final housing since machining, in particular drilling and sawing, of the substrate plate is possible only by means of complicated processing techniques. Non-plate-like shaping of the substrate plate is therefore scarcely possible. Owing to the localized supply of heat, curving of the heated region occurs particularly in the case of a cohesive metal layer, since the thermal expansion thereof is not compensated laterally by the cooler edge region which scarcely expands or does not expand. This curving likewise leads to a deterioration in the vertical final positioning accuracy. For this reason, a continuous metal layer is not employed by those skilled in the art since the local introduction of heat prevents the use of a continuous metal layer. The subsequent precise orientation of a fixed component relative to the substrate plate is possible only by means of an appropriately orientable component holder.

It is an object of the present invention to provide a method for fixing a component having a miniaturized, in particular a microoptical, element on a support plate by means of a solder joint, which method is distinguished by high accuracy of final positioning of the components, high process reliability, as simple assembly as possible of the components involved and simple handling.

This object is achieved by realizing the characterizing features of the independent claims. Features which further develop the invention in an alternative or advantageous manner are described in the dependent claims.

The method according to the invention serves for fixing a miniaturized component on a predetermined fixing section of a support plate by means of a solder joint. Support plate is to be understood as meaning that support on which at least one component, preferably a plurality of components, is to be mechanically fixed directly by means of solder and which has a structure which has a strength sufficient for the load requirements, in order to hold a component in its final position.

According to the invention, the support plate is formed throughout from a metallic material. A particularly suitable metallic material is an alloy, such as, for example, steel, stainless steel, Invar or Arcap, a metallic ceramic material suitable for soldering, a metal composite material or another metallic powder or sintered material which is suitable as a base material for soldering. The thickness of the support plate is preferably from 0.5 to 2 mm. The metallic material has a high absorption coefficient for the electromagnetic radiation used in the method. With the use of a laser beam, the material is substantially opaque to laser radiation and has a high laser beam absorption coefficient. For increasing the absorption of the laser beam, it is possible to blacken the support plate on the underside, at least in the fixing section, for example by applying a heat-resistant black coating. The relatively good thermal conductivity of the support plate consisting throughout of metallic material means that there is no bimetal-like bending, since the lower and upper sides of the support plate can immediately reach the same temperature. The at least one fixing section of the support is enclosed by a cut-out region in the support plate which is bridged by at least one connecting web. This cut-out region is, for example, in the form of a continuous perpendicular slit in the support plate, which encloses the cut-out region, interrupted by the at least one connecting web, in particular in an annular manner. The cut-out region in the support plate can be produced, for example, by means of punching, laser cutting, water jet cutting, electroerosive metal processing or machining, in particular by milling. The fixing section is preferably dimensioned and formed in such a way that a single component can be fixed on the fixing section. The at least one connecting web is, for example, in the form of a straight web directed toward the centre of the fixing section, in the form of a curved or meandering web or bent in a spring-like manner—in particular in a zigzag arrangement. The cut-out region may have any desired basic shape, preferably a round, elliptical, square or polygonal basic shape or a basic shape of any form. In a possible embodiment the cut-out region is in the form of a substantially annular cut-out which is bridged by the at least one connecting web, preferably by a plurality of radial connecting webs, for example three radial connecting webs, distributed along the annular cut-out at uniform angular distances, for example of 120°. In a further development, the cut-out region is formed by a plurality of annular cut-outs arranged concentrically a distance apart, for example the first connecting webs of a first annular recess which are distributed at uniform angular distances and the second connecting webs of a second immediately adjacent annular cut-out which are distributed at uniform angular distances being arranged offset by half the angular distance and being connected via an annular connecting web radially separating the first annular cut-out and the second annular cut-out. As a result of this arrangement, a lateral thermal expansion of the fixing section in the lateral direction by deformation of the annular connecting web, which has a spring-like action, is compensated. The cut-out region is preferably bridged in such a way that, along the average—in particular circular—circumference of the cut-out region, the fraction formed by the at least one connecting web of the support plate is substantially smaller than the cut-out fraction. Average circumference is to be understood as meaning a circumference running on average centrally in the cut-out region and passing through the at least one connecting web. This is the average ring circumference, for example in the case of an annular cut-out region. The fraction bridged by the at least one connecting web is preferably less than 20%, in particular less than 15% of the total average circumference. The support plate including the fixing section and the at least one connecting web is preferably integral. However, it is possible for the support plate and the fixing section to consist of separate parts which are optionally produced from different materials and are coupled to one another by means of at least one connecting web.

This development according to the invention ensures in particular that the thermal conduction from the fixing section, whose dimensions may be limited to the base of the component, to the remaining support plate can be reduced to a minimum. The at least one connecting web couples the fixing section mechanically to the remaining support plate without creating an excessively great heat transfer. It is thus possible to ensure that, by application of a relatively small quantity of energy, only that fixing section of the support plate which serves as a heating surface for the solder material is heated without thereby heating up the remaining fraction of the support plate to an excessive extent. Owing to the relatively high thermal conductivity of the metallic material, the fixing section can be heated rapidly and uniformly. As a result, homogeneous wettability with solder material is achieved. A further advantage is that the at least one connecting web can be designed in such a way that it has a spring-like yielding action in the lateral direction so that a lateral thermal expansion of the fixing section during the supply of electromagnetic radiation is compensated both by the cut-out region and by the at least one yielding connecting web and does not affect the remaining, unheated part of the support plate. Owing to the spring-like slit and connecting web structure the very problematic curving in the prior art owing to local thermal expansion can be avoided by means of compensation of thermal stresses in the support plate.

Since the support plate consists of a metallic material it is possible to choose a material which can be easily processed by means of a cutting or non-cutting method, e.g. steel so that, for example, holes for fixing screws or for mounting additional components are possible without problems. It is also possible to impart any desired three-dimensional shape to the support plate by means of working, in particular deep-drawing. A support plate is therefore also to be understood as meaning a non-flat—for example arched—body. It is also possible, by plastic deformation of the at least one connecting web, to orient the fixing section, including any already fixed component, relative to the remaining support plate without an orientable component holder being required for this purpose—as known from the prior art.

For explaining the method the top of the support plate is defined as the reference plane and the side facing the component so that the vertical or the perpendicular is to be understood as meaning a normal to the support plate, and the horizontal or the lateral direction is to be understood as meaning the direction or plane parallel to the top of the support plate. The same applies to terms such as "above" or "below". This is because it is of course possible to carry out the method described not only on a horizontally aligned support plate as shown but also on an oblique or upside down support plate or a support plate oriented in another manner. The top and bottom of the support plate are therefore not based on an absolute superior reference system. The bottom of the support plate is the side facing away from the component.

The base of the component is to be understood as meaning that section of the component which is at least partly wetted by the molten solder material in the course of the method and thus contributes to the fixing on the support plate. The component or at least the base may consist in particular of a metallic material, as known from the prior art, or of metallic ceramic. This base can, as disclosed, for example, in EP 1127287 B1, WO 99/26754 and WO 2004/050287 A1, have the form of a lateral cylinder surface or the form of a spherical segment. Very good results are obtained if the material of the component or of the base is identical to that of the support plate.

Solder material is applied at least partly on the top of the fixing section of the support plate for example in the form of a flat piece of solder material positioned so as to be horizontally displaceable in the center of the fixing section loosely on the surface, in the form of a solder material layer applied continuously or in the manner of a pattern in the fixing section, or in another manner.

Tin alloys known from the prior art, for example flux-free solder material comprising Sn96Ag4, are particularly suitable as solder material.

In a further development of the invention, the base of the component has the shape of a hollow cylinder open at the bottom—in particular of a straight circular hollow cylinder—whose cylinder axis is perpendicular to the support plate. The cylinder wall is formed so as to be thin in order to keep the thermal conduction from the molten hot solder material to the component, in particular to any microoptical element arranged there, as low as possible. The still non-molten solder material applied on the top of the fixing section is formed here as a flat piece of solder material which has the base shape of a flat cylinder, and is arranged so as to be horizontally displaceable on the fixing section. The external diameter of the solder material is smaller than the internal diameter of the hollow cylinder.

In a first step of the method for high-precision fixing of the miniaturized component, in particular comprising a microoptical element, on a pre-determined fixing section of a support plate by a solder joint, high-precision arrangement of the component above the fixing section is effected, the solder material and the base of the component being present in opposite positions without contact, a distance—in particular a vertical distance—apart and forming a space. In a further development of the invention described above, in which the base of the component has the shape of a hollow cylinder open at the bottom, this step of the method comprises, in a first part-step, the arranging of the component above the fixing section, the solder material being enclosed by the hollow cylindrical base in the opposite position without contact, a distance apart and forming a space, and, in a second part-step, the highly precise horizontal fine positioning of the component, the hollow cylindrical base of the enclosed solder material also moving horizontally. This last-mentioned part-step comprises, in a further development of the invention, a first sub-step of the horizontal fine positioning of the solder material by displacement of the enclosed solder material by horizontal pre-positioning of the component, the hollow cylindrical base of the enclosed solder material also moving horizontally, and a second sub-step of the highly precise horizontal fine positioning of the component. This further development of the invention ensures that, by means of the horizontal positioning of the component above the support plate, the solder material can likewise be positioned at the same time and optionally can be precisely oriented centrally relative to the base of the component. Thus, it is possible to prevent the solder material solidifying with shrinkage from influencing the horizontal orientation of the component since, in the case of a symmetrical arrangement of the component, the shrinkage results substantially exclusively in a vertical change of position of the component in the direction toward the support plate, but the remaining 5 degrees of freedom remain uninfluenced.

In a second step of the method electromagnetic radiation is supplied in a region of the bottom of the support plate which is substantially localized on the fixing section, so that the solder material at least partly melts and, owing to its surface tension in the liquefied state—forms a drop of solder material. The originally flat solder material thus assumes, by drop formation, a vertical dimension increasing in the vertical direction toward the base of the component so that the vertical distance between the solder material and the component decreases. In a part-step, the vertical distance from the component to the support plate is optionally additionally reduced by lowering the component from the starting position in the direction toward the support plate. As a result of the drop formation and optionally also as a result of the lowering of the component, the space for mutual fixing fills with the molten solder material so that the base of the component is wetted at least partly with the molten solder material.

The electromagnetic radiation is preferably formed by a laser beam. In this case, the supply of electromagnetic radiation is localized by directing the laser beam on to the bottom of the fixing section so that the laser beam is substantially absorbed by the bottom of the fixing section and heats the fixing section so that the solder material on the top of the fixing section at least partly melts. The absorption can be increased by blackening the bottom of the fixing section.

In a third step of the method, in which electromagnetic radiation is no longer supplied, it is necessary to wait for the mutual fixing by re-solidification of the molten solder material.

The arrangement of the component is preferably effected by means of a handling system, in particular of a gripper. In a further development of the invention, in the waiting step in which the molten solder material solidifies with shrinkage, the forces acting on the component from the handling system as a result of the shrinkage, are substantially compensated in particular by means of an actively or passively yielding gripper, as disclosed in WO 2004/052070 A1.

In a further optional step it is possible to fill the cut-out region not bridged by the at least one connecting web at least partly with a liquid, solidifying filling material for at least partial bridging of the cut-out region. Suitable filling material is, for example, adhesive or solder. As a result of this, the fixing section connected mechanically only via the at least one connecting web to the remaining support plate and thus possibly not fixed permanently or sufficiently can be securely and permanently fixed so that depositioning of the component due to an unintentional movement of the fixing section relative to the remaining support plate is prevented. A precise orientation of the fixing section, including the component fixed there, which is permitted by plastic deformation of the connecting webs can be permanently fixed thereby.

The combination of the component support in the form of the support plate with the solder material support in the form of the metal surface appeared to be completely paradoxical to date on the basis of the knowledge from the prior art, since the prior art teaches the use of a mechanical support body transparent to the electromagnetic radiation used for heating, preferably in the form of a Pyrex plate and the application thereon of a metal layer which is as thin as possible and whose only function is the wettability with solder material. Those skilled in the art had to date the prejudice that the combination of a solder material support with a mechanical component support in this technical field is impossible because very high stresses occur in the support owing to the localized introduction of a large quantity of heat and the correspondingly great temperature gradient, so that distortion of the support would occur and hence high accuracy of the final positioning would not be achievable. Practical experiments with a metal layer applied continuously on a Pyrex support, as disclosed in WO 2004/050287 A1 initially also appeared to confirm this prejudice. However, in spite of the contrary teaching, the invention takes up the concept of the combination of a component support with a solder material support, with the result that surprisingly considerable advantages can be achieved compared with the prior art.

The method according to the invention and the device according to the invention are described in more detail below, purely by way of example, with reference to specific working examples shown schematically in the drawings, further advantages of the invention also being discussed. Here, reference numerals of previously explained figures will be used in some cases. Specifically:

FIG. 3a, 3b show the arrangement of a component before (FIG. 3a) and after (FIG. 3b) the production of the solder joint in a cross-sectional view; and FIG. 4a to 4d show the arrangement of a component having a hollow cylindrical base, the orientation of a flat piece of solder material and of the component and the production of the solder joint in a cross-sectional view.

Figure 1:
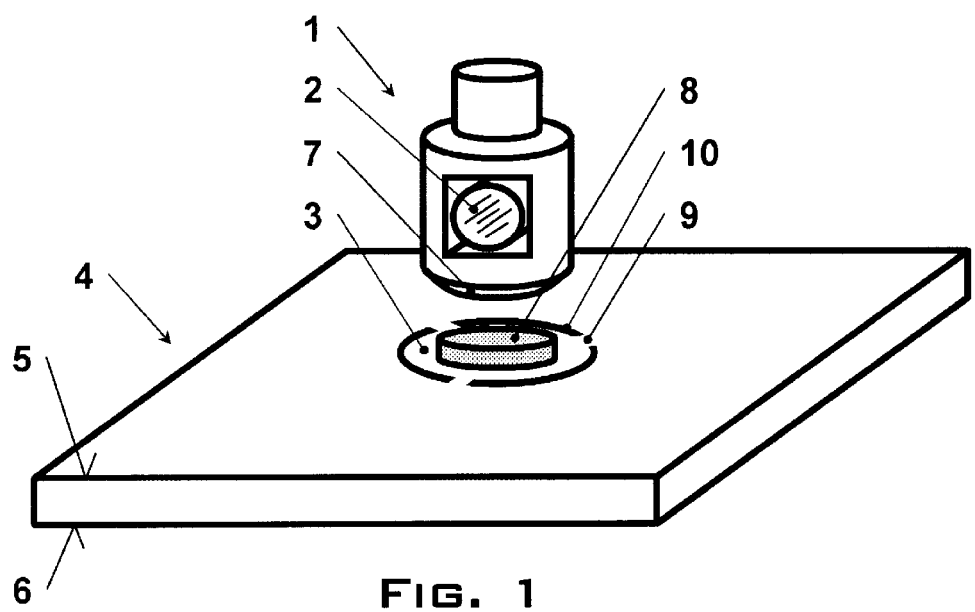
FIG. 1 shows the arrangement of a component above a fixing section surrounded by an annular cut-out region and belonging to a support plate, prior to production of the solder joint, in an oblique view.

FIG. 1 shows a flat metal support plate 4 in whose center a fixing section 3 is formed, which fixing section is enclosed by an annular cut-out region 10 which is composed of three arc-shaped slits which run vertically through the support plate 4 from its top 5 to its bottom 6 and in each case are separated by a connecting web 9. The three connecting webs 9 couple the fixing section 3 mechanically to the remaining support plate 4 and run radially to the horizontal center of the annular cut-out region 10. The support plate 4, its fixing section 3 and its three connecting webs 9 are formed integrally from metal. Solder material 8 which has the base shape of a flat cylindrical stump is present on the top 5 of the fixing section 3. A component 1 which carries a microoptical element 2 is arranged above the fixing section 3 and the solder material 8 in such a way that the solder material 8 and the base 7 of the component 1 are present in opposite positions without contact, a slight vertical distance apart and forming a space. The base 7 of the component 1 is formed by a spherical segment of metal and has good wettability for the molten solder material.

Figure 2:
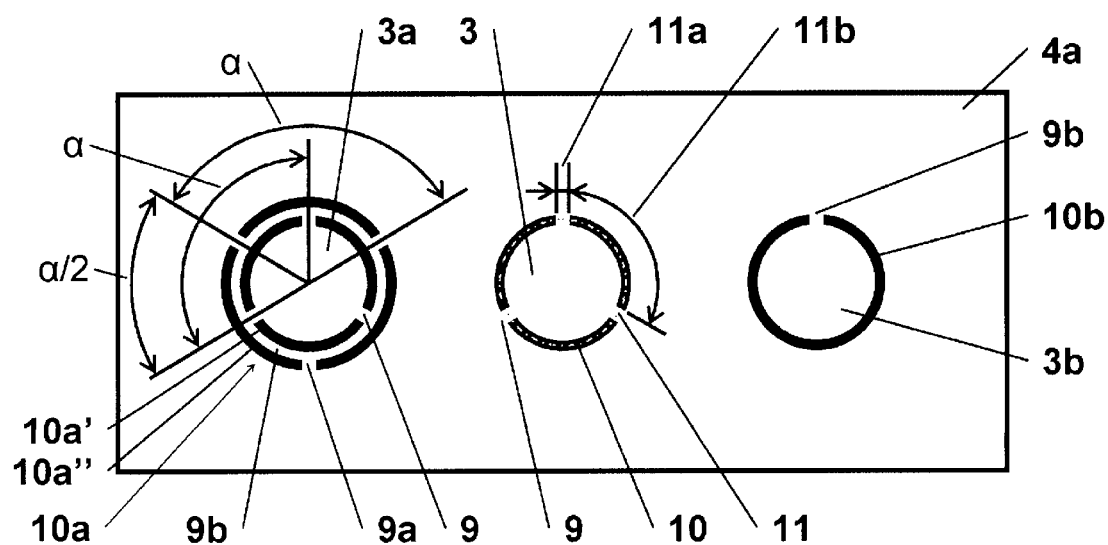
FIG. 2 shows a support plate having three fixing sections surrounded by different annular cut-out regions.

FIG. 2 shows a support plate 4a in which three different fixing sections 3, 3a and 3b are formed. The middle fixing section 3 is the same as that from FIG. 1 and is enclosed by the cut-out region 10 which is in the form of a circular recess and is bridged by the three connecting webs 9. The circular average circumference 11 of the circular recess 10 is shown by means of a dash-dot line. As is clearly evident, that fraction 11a of the circumference 11 which is bridged by the three connecting webs 9 is substantially smaller than the cut-out fraction 11b of the circumference, less than 20%, preferably less than 15%, in particular less than 10%, in the working example shown. As a result of this, the heat transfer limited to the connecting webs 9, from the fixing section 3 to the remaining support plate 4a, is substantially limited. The right fixing section 3b is enclosed by a circular recess 10b which is bridged only by a single connecting web 9b. An advantage of this embodiment is the even lower heat transfer to the remaining support plate 4a and the easy orientability of the fixing section 3b relative to the remaining support plate 4a. The left fixing section 3a is enclosed by a cut-out region 10a which is formed by two concentric, annular recesses 10a' and 10a" arranged a distance apart. Each of these two annular recesses 10a' and 10a" is bridged by connecting webs 9 and 9a distributed at uniform angular distances $\alpha$ of 120° and running radially to the center of the fixing section 3a. The first connecting webs 9 of the inner annular recess 10a', which are distributed at angular distances $\alpha$ of 120°, and the second connecting webs 9a of the second directly adjacent outer angular recess 10a" which are likewise distributed at angular distances $\alpha$ of 120° are arranged offset by half the angular distance $\alpha/2$ of 60°. These connecting webs 9 and 9a are in turn connected via an annular connecting web 9b separating the first inner annular recess 10a' and the second outer annular recess 10a". As a result of this offset arrangement lateral thermal expansion of the fixing section 3a can be compensated by deformation of the annular connecting web 9b without curving of a part of the support plate 4a occurring, so that an increased vertical accuracy of final positioning can be achieved.

FIGS. 3a and 3b show the arrangement of the component 1 from FIG. 1 before—cf. FIG. 3a—and after—cf. FIG. 3b—the production of a solder joint in a cross-sectional view. The component 1 with its microoptical element 2 is arranged in FIG. 3a with high precision above the fixing section 3, the solder material 8 and the base 7 of the component 1 being present in opposite positions without contact, vertically a slight distance apart and forming a space. FIG. 3b illustrates the supply of electromagnetic radiation in the form of a laser beam 12 in a region of the bottom 6 of the support plate 4 which is substantially localized on the fixing section 3. The laser beam 12 is absorbed by the bottom 6 of the fixing section 3 and, owing to the relatively high thermal conductivity of the metal, heats said fixing section both horizontally and vertically in a homogenous manner. Owing to the local heating of the fixing section 3, the latter acts as a hotplate and causes the solder material 8 to melt. Owing to the surface tension, drop formation of the molten solder material 8' occurs. In addition, the vertical distance from the component 1 to the support plate 4 is optionally reduced by lowering the component 1 from a starting position toward the support plate 4. As a result of the drop formation and optionally as a result of the lowering of the component 1, the space fills with molten solder material 8' for mutual fixing. Consequently, the base 7 of the component 1 is wetted with the molten solder material 8'. After the laser beam 12 has been switched off, it is necessary to wait for mutual fixing by re-solidification of the molten solder material 8'.

FIG. 4a to 4d show a further embodiment of the method according to the invention. A solder material in the form of a flat piece 8a of solder material, which has the base shape of a flat cylindrical stump having an external solder material diameter $d_{8a}$ is present on the top 5 of the fixing section 3 of the support plate 4. The flat piece 8a of solder material is loosely positioned and is therefore horizontally displaceable on the fixing section 3. The base 7a of the component 1a has the shape of a hollow cylinder which is open at the bottom and has an internal hollow cylinder diameter $d_{7a}$. The external solder material diameter $d_{8a}$ is smaller than the internal hollow cylinder diameter $d_{7a}$. For example $d_{8a}$ is 2.1 mm and $d_{7a}$ is 2.3 mm, the flat piece 8a of solder material having a height of 0.8 mm and the support plate having a thickness of 1.0 mm. In a first step (cf. FIG. 4a) the component 1a is arranged above the fixing section 3 in such a way that the flat piece 8a of solder material is at least partly enclosed by the hollow cylindrical base 7a in opposite positions without contact, a distance apart and forming a space. However, the flat piece 8a of solder material and the component 1a are not yet present in the required horizontal position, which is indicated by the center line 13 shown as a dash-dot line. Since the flat piece 8a of solder material which is present with play within the hollow cylindrical base 7a is to be arranged exactly centrally in the hollow cylindrical base 7a in order to avoid asymmetries which affect in particular the vertical accuracy of final positioning, the flat piece 8a of solder material is initially brought into the central position. This is effected by the step of precise horizontal positioning of solder material, illustrated in FIG. 4b, by displacement of the enclosed flat piece 8a of solder material by horizontal pre-positioning of the component 1a, the hollow cylindrical base 7a simultaneously displacing the enclosed flat piece 8a of solder material horizontally. In a subsequent step (cf. FIG. 4c), the component 1a is positioned with high precision horizontally relative to the center line 13. Since both the flat piece 8a of solder material and the component 1a are now oriented exactly relative to the center line 13 and hence to the required horizontal position a laser beam 12 can be directed at the bottom 6 of the fixing section 3, as described above, in a subsequent step. The molten solder material 8a' wets the inner lateral surface of the thin-wall hollow cylindrical base 7a. An advantage of the development of the base 7a is that the molten solder material 8a' can move vertically upward without inevitably displacing the component 1a vertically. Moreover, the thermal conduction of the solder material 8a' on the upper section of the component 1a on which the possibly thermally highly sensitive microoptical element 2 is arranged is kept very low. In order to prevent stresses due to air enclosed in the hollow cylindrical base 7a, a channel 14 which permits escape of the air and additional heat removal is provided. In a subsequent step not shown, it is necessary to wait for solidification of the solder material 8a' and mutual fixing.

Of course, it is possible to extend the method according to the invention to include already known additional method steps which relate in particular to the positioning of the component by means of a gripper.

The invention claimed is:

1. A method for high-precision fixing of a miniaturized component on a predetermined fixing section of a support plate by a solder joint,
the support plate having a top of a metallic material and a bottom, and the component having a base, and
solder material being applied at least partly on the top of the fixing section of the support plate,
comprising the steps:
high-precision arrangement of the component above the fixing section, the solder material and the base of the component being present in opposite positions without contact, a distance apart and forming a space;
supply of electromagnetic radiation in a region of the bottom of the support plate which is substantially localized on the fixing section for at least partial melting of the solder material resulting in drop formation; and
waiting for the mutual fixing by re-solidification of the molten solder material, wherein the support plate:
is formed throughout from a metallic material; and
has a cut-out region enclosing the fixing section and bridged by at least one connecting web of the support plate.

2. The method as claimed in claim 1, wherein the fixing section is dimensioned and designed in such a way that a single component can be fixed on the fixing section.

3. The method as claimed in claim 1, wherein the cutout region is in the form of at least one substantially annular recess which is bridged by the at least one connecting web.

4. The method as claimed in claim 3, wherein the annular recess is bridged by a plurality of radial connecting webs distributed along the annular recess at uniform angular distances.

5. The method as claimed in claim 4, wherein the annular recess is bridged by three radial connecting webs distributed along the annular recess at uniform angular distances of 120°.

6. The method as claimed in claim 4, wherein the cut-out region is formed by a plurality of concentric, annular recesses arranged a distance apart.

7. The method as claimed in claim 6, wherein:
the first connecting webs of a first annular recess which are distributed at uniform angular distances; and
the second connecting webs of a second immediately adjacent annular recess which are distributed at uniform angular distances
are arranged offset by half the angular distance and are connected via an annular connecting web separating the first annular recess and the second annular recess so that lateral thermal expansion of the fixing section can be compensated by deformation of the annular connecting web.

8. The method as claimed in claim 1, wherein the cut-out region is formed in such a way that, along the average, in particular circular, circumference of the cut-out region, the fraction bridged by the at least one connecting web of the support plate is substantially smaller than the cut-out fraction.

9. The method as claimed in claim 8, wherein the bridged fraction is less than 20%.

10. The method as claimed in claim 1, wherein the support plate is formed throughout from steel.

11. The method as claimed in claim 1, wherein the support plate is formed throughout from a metallic ceramic material.

12. The method as claimed in claim 1, wherein:
the electromagnetic radiation is formed by a laser beam; and
the supply of the electromagnetic radiation is localized by directing the laser beam at the bottom of the fixing section so that the laser beam is substantially absorbed by the bottom of the fixing section and the fixing section is heated so that the solder material on the top of the fixing section at least partly melts.

13. The method as claimed in claim 12, wherein the bottom of at least the fixing section is blackened for increasing the absorption of the laser beam.

14. The method as claimed in claim 1, wherein
the solder material which is applied to the top of the fixing section and is not yet molten is in the form of a flat piece of solder material which has the base shape of a flat cylindrical stump having an external solder material diameter, and is arranged in a horizontally displaceable manner on the fixing section,
the base of the component has the shape of a hollow cylinder open at the bottom and having an internal hollow cylinder diameter,
the external solder material diameter is smaller than the internal hollow cylinder diameter and
the step comprising arrangement of the component comprises the following part-steps:
arrangement of the component above the fixing section, the solder material being at least partly enclosed by the hollow cylindrical base in an opposite position without contact, a distance away and forming a space, and
high-precision horizontal positioning of the component, the hollow cylindrical base simultaneously displacing the enclosed flat piece of solder material horizontally.

15. The method as claimed in claim 14, wherein the part-step comprising the high-precision horizontal positioning comprises the following part-steps:
horizontal fine positioning of solder material by displacement of the enclosed flat piece of solder material by horizontal pre-positioning of the component, the hollow cylindrical base simultaneously displacing the enclosed flat piece of solder material horizontally, and
high-precision horizontal positioning of the component.

16. The method as claimed in claim 1, comprising the further step:
at least partial filling of the cut-out region with a liquid, solidifying filling material for at least partial bridging of the cut-out region not bridged by the at least one connecting web.

17. The method as claimed in claim 1, wherein the metallic material an alloy or metallic ceramic material.

18. The method as claimed in claim 2, wherein the cutout region is in the form of at least one substantially annular recess which is bridged by the at least one connecting web.

19. The method as claimed in claim 5, wherein the cut-out region is formed by a plurality of concentric, annular recesses arranged a distance apart.

20. The method as claimed in claim 9, wherein the bridged fraction is less than 15%.

21. The method as claimed in claim 1, wherein the miniaturized component has a microoptical element and the supply of electromagnetic radiation in a region of the bottom of the support plate which is substantially localized on the fixing section for at least partial melting of the solder material resulting in drop formation includes reduction of the vertical distance from the component to the support plate by lowering of the component from a starting position toward the support plate so that, as a result of the drop formation and as a result of the lowering of the component the space for mutual fixing fills with molten solder material and the base of the component is at least partly wetted.

* * * * *